United States Patent
Statham

(10) Patent No.: US 9,704,688 B2
(45) Date of Patent: Jul. 11, 2017

(54) X-RAY ANALYSIS IN AIR

(71) Applicant: Oxford Instruments Nanotechnology Tools Limited, Oxon (GB)

(72) Inventor: Peter Statham, Buckinghamshire (GB)

(73) Assignee: Oxford Instruments Nanotechnology Tools Limited, Oxon (GB)

( * ) Notice: Subject to any disclaimer, the term of this patent is extended or adjusted under 35 U.S.C. 154(b) by 0 days.

(21) Appl. No.: 15/024,773

(22) PCT Filed: Sep. 25, 2014

(86) PCT No.: PCT/GB2014/052907
§ 371 (c)(1),
(2) Date: Mar. 24, 2016

(87) PCT Pub. No.: WO2015/044665
PCT Pub. Date: Apr. 2, 2015

(65) Prior Publication Data
US 2016/0233051 A1  Aug. 11, 2016

(30) Foreign Application Priority Data
Sep. 25, 2013  (GB) .................................. 1317026.1

(51) Int. Cl.
*H01J 37/00* (2006.01)
*H01J 37/244* (2006.01)
*H01J 37/28* (2006.01)

(52) U.S. Cl.
CPC ............ *H01J 37/244* (2013.01); *H01J 37/28* (2013.01); *H01J 2237/164* (2013.01); *H01J 2237/182* (2013.01); *H01J 2237/188* (2013.01); *H01J 2237/2445* (2013.01); *H01J 2237/24415* (2013.01); *H01J 2237/2608* (2013.01)

(58) Field of Classification Search
USPC ................................ 250/306, 307, 310, 311
See application file for complete search history.

(56) References Cited

U.S. PATENT DOCUMENTS

| 2,991,362 | A  | 7/1961 | Schumacher |
| 5,481,109 | A  | 1/1996 | Ninomiya et al. |
| 6,452,177 | B1 | 9/2002 | Feldman et al. |

FOREIGN PATENT DOCUMENTS

| EP | 1724809 A1 | 11/2006 |
| EP | 1956632 A1 | 8/2008 |
| JP | S-4847394 | 7/1973 |
| WO | WO-2010/132124 A1 | 11/2010 |

*Primary Examiner* — Nicole Ippolito
*Assistant Examiner* — Hanway Chang
(74) *Attorney, Agent, or Firm* — Blank Rome LLP; Michael C. Greenbaum

(57) ABSTRACT

An x-ray analysis apparatus comprises an electron beam assembly for generating a focused electron beam within a first gas pressure environment. A sample assembly is used for retaining a sample within a second gas pressure environment such that the sample receives the electron beam from the electron beam assembly and such that the gas pressure in the second gas pressure environment is greater than the gas pressure within the first gas pressure environment. An x-ray detector is positioned so as to have at least one x-ray sensor element within the first gas pressure environment. The sensor element is mounted to a part of the electron beam assembly which is proximal to the sample assembly and further arranged in use to receive x-rays generated by the interaction between the electron beam and the sample.

19 Claims, 3 Drawing Sheets

X-RAY ANALYSIS IN AIR

RELATED APPLICATIONS

This application is a national phase of PCT/GB2014/052907, filed on Sep. 25, 2014, which claims the benefit of Great Britain Application No. 1317026.1, filed on Sep. 25, 2013. The entire contents of those applications are incorporated herein by reference.

FIELD OF INVENTION

The present invention relates to an apparatus and method for x-ray analysis, particularly that enables x-ray elemental analysis of specimens at partial or full atmospheric pressure at high spatial resolution using a focussed electron beam.

BACKGROUND TO THE INVENTION

With reference to FIG. 1, for x-ray analysis in an electron microscope (EM) 100, an x-ray spectrum is measured by sensing and measuring the energies of individual x-ray photons emitted by a specimen 101 when it is hit by a focussed electron beam 102. (Note that in this document, the convention is that the electron beam travels vertically downwards towards the specimen and this is the context for words such as "below" and "above". In practice the electron beam can be oriented in any direction, including vertically upwards.) Each x-ray photon is an energetic particle and the energy is typically converted into charge using a solid state detector 105. The charge is measured so that a count can be recorded and the histogram of recorded measurements represents the digitised x-ray energy spectrum. Peaks characteristic of particular chemical elements can be identified in the x-ray energy spectrum and the intensity of those peaks used as the basis for determining elemental content of the material which is directly under the electron beam 102. The volume of material that is characterised is determined by the diameter of the focussed electron beam and the range of electrons as they scatter within the specimen 101. If the incident electron beam energy is 5 keV, the range of electron scattering is of the order of 100 nm for a bulk steel specimen. At higher incident electron energies, the range in a bulk specimen is greater but if the specimen is thinned so that the electron beam passes through the specimen, the sideways scattering can be reduced. Thus it is usually possible to find a set of conditions where x-ray analysis can be achieved on very small volumes of material provided the size of the focussed beam on the specimen is sufficiently small.

The x-ray detector 105, the final polepiece of the electron microscope 104 and the specimen 101 are all within the same vacuum chamber. The vacuum is primarily needed so that the electrons can be accelerated to several keV energy and focussed to a narrow beam without scattering on gas molecules. However, some specimens such as liquids and hydrated biological material will not be stable under vacuum conditions and cannot be analysed. Furthermore, specimens that are electrically insulating may accumulate charge and the negative voltage can eventually repel the incident beam so that analysis is not possible.

One approach to analysing "wet" samples or insulating samples is the "environmental scanning electron microscope" which uses a small aperture to isolate the "good" vacuum required for producing a focussed electron beam, from the specimen chamber which has gas at a fraction of atmospheric pressure. Since gas flows through the pressure limiting aperture, the microscope has to continually pump to maintain the level of vacuum in the electron column. If the specimen chamber pressure is high, the aperture diameter has to be reduced to allow the pumping to keep up with the leakage. For example, if a 1 mm aperture can just sustain a pressure of 5 Torr which is enough to keep water in its liquid phase, to work at 10 Torr may require a 0.5 mm aperture. However, to work at full atmospheric pressure (760 Torr) would require an aperture that severely limits the range of deflection for the electron beam. Nevertheless, operation at pressures even below 5 Torr is useful because ionised gas atoms help neutralise surface charge that builds up on insulating specimens which can therefore be analysed without having to coat the specimen with a conductive material.

U.S. Pat. No. 6,452,177 describes an alternative approach for analysing specimens in their natural atmosphere. An evacuated electron column generates, accelerates, and focuses electrons and is isolated from the ambient atmosphere by a thin, electron transparent membrane. After passing through the membrane, the electrons impinge on the sample in atmosphere, to generate characteristic x-rays. The x-rays are detected and analysed with a solid-state x-ray detector mounted near the sample and in the ambient atmosphere of the sample. When the electron beam emerges from the membrane it is scattered by gas molecules in the ambient atmosphere. With a 30 keV beam, the combined scattering in the membrane and atmospheric gas broadens the finely focussed beam into a broad spot 1 mm in diameter at 2 cm working distance from the specimen. Furthermore, even if the x-ray detector is fitted with a thin polymer window, x-rays are still absorbed in the gaseous atmosphere. For example, if the detector is only 3 mm away from the specimen, low energy x-rays are strongly absorbed by air at atmospheric pressure (1 Bar) as seen in FIG. 2.

The use of an electron-transparent membrane overcomes some of the problems associated with differential pumping apertures. Sealing the vacuum with a membrane avoids the need for continuous pumping. The membrane diameter can also be larger than that of the small pumping aperture required to sustain a differential of one atmosphere of pressure. Provided the membrane is thin and the electron beam energy is high enough, there is not much sideways scattering within the membrane. Furthermore, if the specimen is placed very near to the membrane, scattering off gas molecules is minimal so the incident electron beam remains focussed to a small spot.

In a microscope with differential pumping it is also advantageous to reduce scattering off gas molecules by moving the specimen very close to the pumping aperture. The pumping aperture or membrane will be close to the bottom face of the polepiece (104, FIG. 1) of the final lens. However, when the specimen (101) is placed very near to the polepiece (104) it is difficult for the detector (105) to get line of sight of the beam spot and consequently x-ray detection is inefficient.

Therefore, it is desirable to have an efficient method of detecting x-rays in a microscope that has been designed to accommodate specimens at atmospheric pressure or at sufficiently high pressure to work with liquid or non-conductive specimens.

SUMMARY OF THE INVENTION

In accordance with a first aspect of the invention we provide x-ray analysis apparatus comprising:

an electron beam assembly for generating a focused electron beam within a first gas pressure environment;

a sample assembly for retaining a sample within a second gas pressure environment and arranged when in use such that the sample receives the electron beam from the electron beam assembly and such that the gas pressure in the second gas pressure environment is greater than the gas pressure within the first gas pressure environment, and, an x-ray detector having at least one x-ray sensor element within the first gas pressure environment, the at least one x-ray sensor element being mounted to a part of the electron beam assembly which is proximal to the sample assembly and further arranged in use to receive x-rays generated by the interaction between the electron beam and the sample.

A key benefit of the current invention is to establish an instrument configuration whereby: the x-ray detector sensor, which may be composed of a series of elements, can be positioned in a vacuum environment to minimise x-ray absorption; the specimen is in an environment of higher pressure; the incident electron beam travels a minimal distance in the specimen environment; and, x-rays excited from the spot on the specimen beneath the focussed incident beam have clear line of sight to the detector so that the detector elements subtend a large solid angle at the beam spot. The large solid angle is preferably provided by minimising the distance between the sensor elements and the specimen.

This configuration is achieved, preferably, by making the sensor very small and positioning the sensitive detector surfaces close to the "aperture" that separates the vacuum in the electron column from the higher pressure environment of the specimen.

The invention is generally applicable to x-ray analysis apparatus which typically includes electron microscopes. Whilst the invention may be utilised with various types of electron microscope it finds particular practical benefit when used in scanning electron microscopes. Preferably the at least one x-ray sensor element is positioned within the final lens bore or below the polepiece so that it is accessible from below the polepiece. It is also preferred that the x-ray sensor, which comprises the one or more sensor elements, and more preferably any associated cooling assembly, can be removed without disassembling the electron optical column. It is contemplated that the use of an x-ray detector in the form of at least one silicon drift detector may be particularly beneficial. The detector sensor preferably comprises a series of two or more sensor elements. These are preferably arranged in "parallel". For example each element may be defined by a planar (two dimensional) surface which receives incident x-rays, and the surfaces are mutually arranged such that at least a vector exists within each surface which is parallel to the vectors of other surfaces. Thus each planar surface may be defined by a plane normal and each surface may be arranged to have plane normal which is substantially orthogonal to the axis of propagation of the electron beam. Alternatively the surfaces may have plane normals substantially parallel to the said axis of propagation. However, it should be understood that "non-parallel" arrangements are also contemplated, for example in which the surfaces are tilted such that they more directly face the beam spot on the specimen. The plane normals may therefore be arranged to intersect with the specimen, most preferably with the beam spot location on the specimen. Typically a plurality of said elements is provided arranged in a distributed manner around the electron beam axis. This distribution arrangement of the elements may be symmetrical for example circumferentially about the axis, depending upon the electron beam assembly.

Preferably a differential pressure element is utilised for dividing the first and second pressure environments and arranged to allow passage of each of, the electron beam to the sample, and x-rays from the sample. The differential pressure element at least permits transmission of electrons and x-rays through it which may be achieved by a combination of low interaction materials and low thickness. It is desirable for the differential pressure element to be as transparent as possible (minimising attenuation of electrons or x-rays). The differential pressure element is typically either, formed from a material which is a substantially electron and x-ray transmissive material, or, is a small physical aperture (hole). Each alternative can be thought of as an electron aperture. Thus, in use, each of, the electron beam and the generated x-rays, is caused to pass between the first and second gas pressure environments through the differential pressure element which is operative to maintain the pressure differential between the first and second gas pressure environments. Typically, the at least one x-ray sensor element is positioned upon a first side of the differential pressure element and the sample is positioned upon a second side of the differential pressure element. The element may be an "aperture" which may or may not have an electron-transparent membrane across it. The specimen surface is typically positioned closely below (more generally, adjacent) the same aperture so that the x-ray sensor has line of sight of the incident focussed electron beam spot and the active elements of the sensor subtend a large solid angle at the beam spot.

It will be understood that the respective first and second pressure environments are normally provided by using respective vacuum pumping systems, or, in the case of the second environment being at ambient pressure, then at least one vacuum pumping system. Preferably the at least one x-ray sensor element is provided within a module which is arranged in pressure communication with the electron beam assembly such that the first pressure environment is provided within the module. It is desirable that the module is removably mountable to an exit region of the electron beam assembly such that the module may be attached and detached without additional disassembly of the electron beam assembly. The provision of the at least one sensor element in the module, located in use between the electron beam assembly and the sample (specimen), serves to maximise the solid angle presented by the at least one element to the beam spot. A total sensor solid angle of greater than 0.8 steradian may be achieved in this way. Preferably the differential pressure element is arranged in a wall of the module, such as a wall facing the sample. This also increases the total solid angle presented by the sensor element(s). Likewise the differential pressure element is also preferably removably mountable to the module, such that the module may remain in situ during detachment and reattachment of the differential pressure element. The module may further comprises at least one cooling device for cooling the at least one x-ray sensor element. Such devices include Peltier coolers, one of which may be provided for each sensor element for example.

The electron beam assembly typically takes the form of an electron beam column. Preferably the assembly includes a polepiece from which the electron beam emerges towards the sample (normally at the lower end of the column) and wherein the module is mounted within the polepiece or to the end of the polepiece.

The additional advantage of this configuration is that the detector sensor elements and any associated Peltier cooling can be built into a package that can be fitted beneath the final lens polepiece of the instrument with electrical connections coming out to the side so that the unit can be removed for repair or replacement without disassembling the electron column.

In accordance with a second aspect of the invention we provide a method of x-ray detection comprising:
generating a focused electron beam within a first gas pressure environment of an electron beam assembly;
providing a sample within a second gas pressure environment, such that the gas pressure in the second gas pressure environment is greater than the gas pressure within the first gas pressure environment;
causing the electron beam to impinge upon the sample and thereby generate x-rays; and,
receiving the generated x-rays using at least one x-ray sensor element of an x-ray detector, the at least one x-ray sensor element being within the first gas pressure environment and mounted to part of the electron beam assembly proximal to the sample.

Thus we provide a method of detecting x-rays in an electron microscope instrument for which the specimen environment is at higher pressure than in the final lens where the x-ray detector sensor is positioned within the vacuum environment of the final lens and separated from the specimen environment by either a differential pumping aperture (hole) or a thin electron-transparent membrane.

Advantageously, the x-ray detector sensor may be within the final lens bore or below the polepiece so that it is accessible from below the polepiece. It is beneficial for the x-ray detector sensor and/or associated cooling assembly to be configured to be removed without disassembling the electron optical column. The x-ray detector is typically a silicon drift detector and, furthermore, typically the detector sensor comprises a series of detection elements in parallel.

DESCRIPTION OF THE DRAWINGS

Some examples of apparatus and methods according to the invention at now described with reference to the accompanying drawings, in which.

DESCRIPTION OF EXAMPLES

Figure 1:
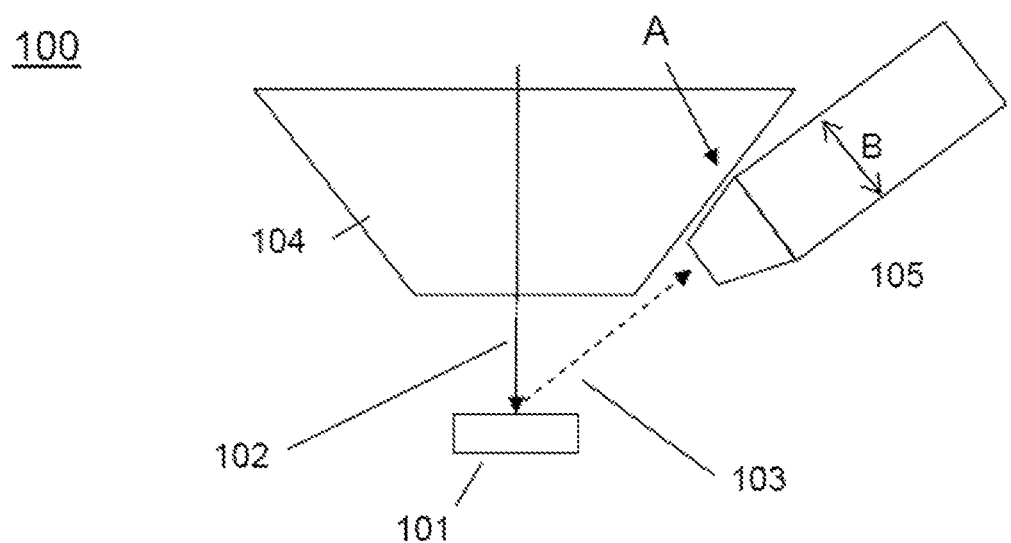
FIG. 1 shows a prior art arrangement for x-ray analysis in an electron microscope.
Figure 2:
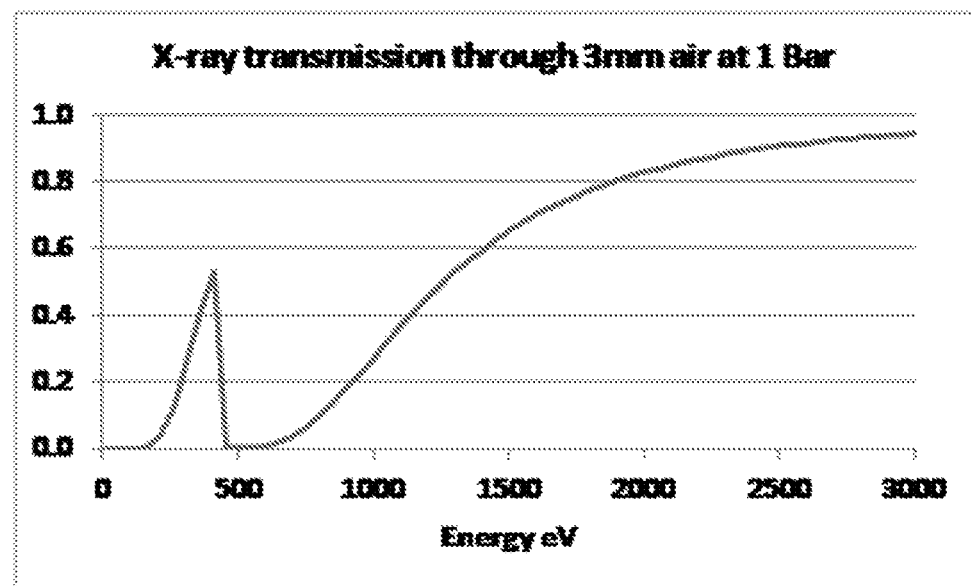
FIG. 2 shows the relationship between transmission of x-rays in air and x-ray energy at approximately atmospheric pressure.
Figure 3:
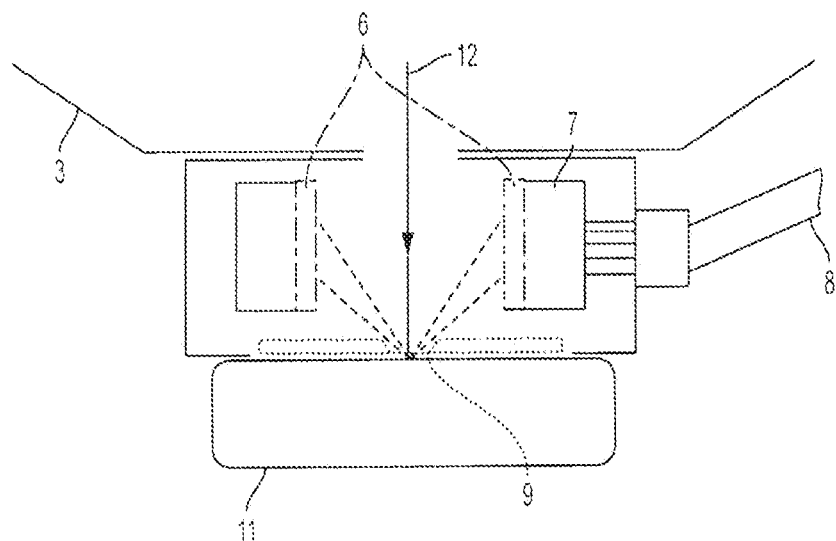
FIG. 3 shows a first example apparatus according to the invention having "vertical" sensor elements.

In one embodiment of the invention shown in FIG. 3, a detector module 2 is shown positioned immediately below the final lens polepiece 3 of an electron microscope 4. The x-ray sensor 5 of the detector module 2 is composed of four individual silicon drift detector (SDD) elements 6 arranged symmetrically around the central axis with their sensitive faces arranged vertically. Each element 6 is 0.5 mm thick and the front surface is 3 mm in height and 4 mm deep. Each element 6 is mounted on a Peltier cooling stack 7 and the electrical connections are taken through a feedthrough and cable loom 8 out to external electronics for controlling the cooling, electrically biasing the detector elements and sensing and measuring the signals. Peltier coolers require a heat sink and are thermally-connected to the casing of the detector module. If the specimen is in full atmosphere, the heat sink can be fins attached to the casing. Alternatively, the casing can be thermally connected to the large metal mass of the final polepiece 3 of the electron microscope 4.

The aperture 9 shown, which separates the gaseous environments, is 0.5 mm in diameter and in this case is sealed with a membrane 10, although it could be a differential pumping aperture. The membrane 10 is made of silicon nitride supported on a silicon wafer substrate and is typically 5 nm to 100 nm thick so is transparent to electrons with energy greater than a few keV. Other materials such as graphene may be used to achieve even thinner membranes. The specimen 11 is raised so that the surface is typically less than 0.1 mm away from the aperture. This can be achieved by optical positioning. The focussed electron beam 12 then strikes the sample specimen 11 at a point where the emerging x-rays can be accepted by the sensitive regions of the SDD sensor elements 6. In this case, the solid angle subtended by each sensor element is approximately 0.22 steradian giving a total of 0.88 steradian for the total sensor solid angle. This is illustrated in FIG. 3.

Figure 4:
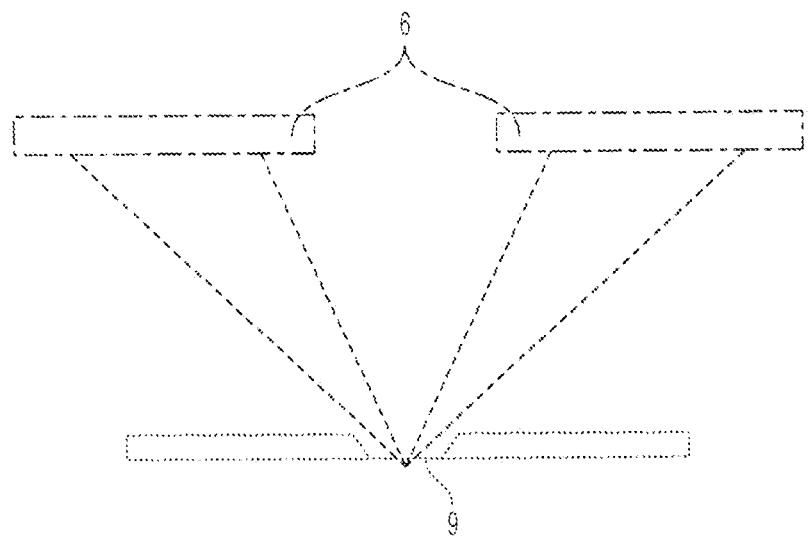
FIG. 4 shows a second example apparatus according to the invention having "horizontal" sensor elements; and, FIG. 5 is a flow diagram of an example method applicable to each example apparatus.

An alternative arrangement for the sensor elements is shown in FIG. 4 where the SDD elements 6' are flat and collinear so they can all be fabricated from a single wafer of silicon. The elements 6' are shown with their sensitive surfaces 4 mm above the specimen surface and achieve a solid angle of the same order as that for FIG. 3. The module 2' is fixed to the bottom of the polepiece 3 to form a vacuum seal so that the volume inside the module shares the vacuum with the focussed incident beam 12. The exit aperture for the beam will either be a differential pumping aperture or a membrane, as shown in FIG. 4, that forms a vacuum seal to isolate the electron column vacuum from the higher pressure environment of the specimen. As in the case of the example shown in FIG. 3, the module 2' can be removed to service or replace the detector module if any of the detector elements or membrane gets damaged. The membrane support, or disk with aperture, can also be made removable so that alternative sized pumping apertures can be used or broken membranes replaced without removing the whole detector module from the polepiece. The module 2' could also be engineered as an insert that goes up inside the final polepiece and forms part of the final lens so that the final aperture is closer to the polepiece.

As a further consideration, high energy electrons that are scattered back from the specimen will travel back through the membrane or vacuum aperture. If they strike the detector, they contribute an undesirable background signal. To attenuate this undesirable background, a filter material may be placed in front of the detector elements. For example, this can take the form of a thin cylinder of a material such as Mylar where the thickness is chosen to attenuate electrons while permitting x-rays to pass through to the detector. Any material filter will have some detrimental effect on the x-ray spectrum because very low energy x-rays will be absorbed. In some microscope lens configurations, the specimen will be immersed in a strong vertical magnetic field. In this case, back-scattered electrons will be constrained in helices by the action of the magnetic field and will spiral back up the electron column so that it is not necessary to use a filter and better x-ray sensitivity can be achieved.

Figure 5:
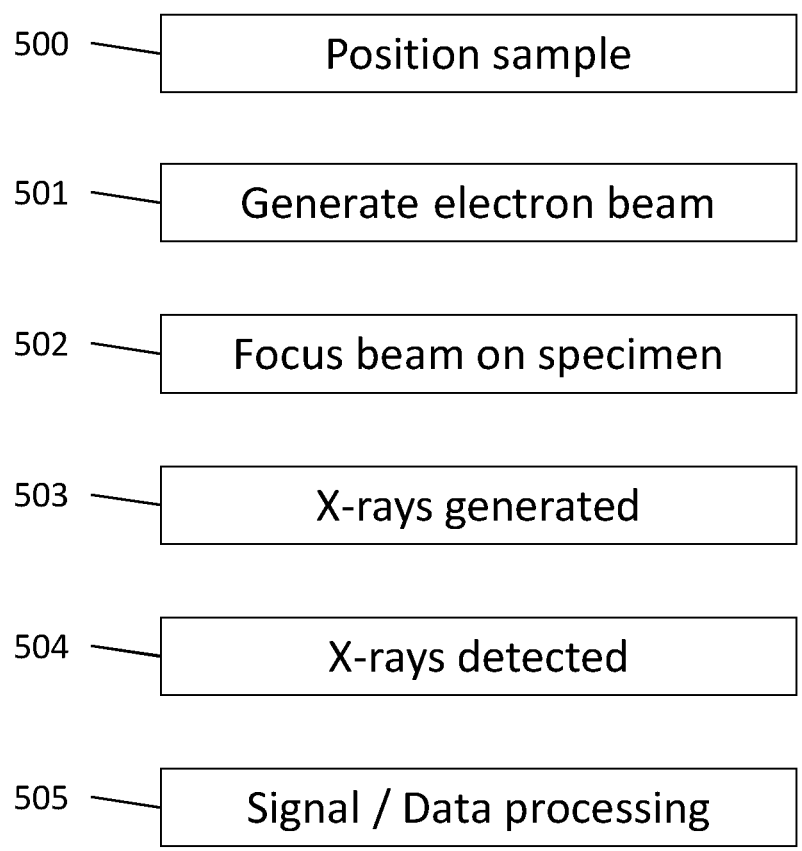

As shown in FIG. 5, when in use, the sample specimen 11 is firstly placed in the higher pressure environment at step 500 whilst ensuring that the relative pressures within the module and electron microscope column are stabilised. This positioning includes the moving of the sample into close proximity with the aperture (with or without the membrane as applicable). The electron beam 12, having previously been initiated and stabilised at step 501, is then focused upon the surface of the specimen 11 through the aperture at step 502. This causes the generation of x-rays at step 503. The x-rays that are generated radiate from an interaction volume within the specimen. A proportion of the x-rays pass through the aperture and are incident upon the sensor elements 6,6' where they are detected at step 504. This produces corresponding signals which are then converted into data for processing by a control and analysis system. As will be understood, typically such a system includes a computer for the processing and presentation of the data to a user.

As will be appreciated, when in use, the specimen is brought as close to the aperture as possible so as to reduce the propagation path length of the x-rays within the higher pressure environment of the specimen. The x-ray detector is however positioned within the lower pressure environment allowing optimising of its positioning, between the polepiece and the specimen, without the reduction in signal which would otherwise occur were it positioned within the higher pressure environment. An additional advantage of the arrangement is that the positioning of the member containing the aperture between the detector and the specimen also provides a physical barrier preventing the specimen from impacting the sensitive detector elements.

The invention claimed is:

1. X-ray analysis apparatus comprising:
    an electron beam assembly for generating a focused electron beam within a first gas pressure environment;
    a sample assembly for retaining a sample within a second gas pressure environment and arranged when in use such that the sample receives the electron beam from the electron beam assembly and such that the gas pressure in the second gas pressure environment is greater than the gas pressure within the first gas pressure environment, and,
    an x-ray detector having at least one x-ray sensor element within the first gas pressure environment, the at least one x-ray sensor element being mounted to a part of the electron beam assembly which is proximal to the sample assembly and further arranged in use to receive x-rays generated by the interaction between the electron beam and the sample.

2. Apparatus according to claim 1, wherein the electron beam defines an axis of propagation and wherein the at least one x-ray sensor element has a planar surface for the receipt of x-ray photons.

3. Apparatus according to claim 2, wherein said planar surface is defined by a plane normal which is arranged substantially orthogonal to the said axis of propagation.

4. Apparatus according to claim 3, wherein a plurality of said elements are provided, arranged in a distributed manner around the electron beam axis.

5. Apparatus according to claim 2, wherein said planar surface is defined by a plane normal which is arranged substantially parallel to the said axis of propagation.

6. Apparatus according to claim 1, further comprising a differential pressure element for dividing the first and second pressure environments and arranged to allow passage of each of the electron beam to the sample, and x-rays from the sample.

7. Apparatus according to claim 6, wherein the differential pressure element is either, formed from a material which is a substantially electron and x-ray transmissive material, or, a physical aperture.

8. Apparatus according to claim 1, further comprising a module within which the at least one x-ray sensor element is located, the module being arranged in pressure communication with the electron beam assembly such that first pressure environment is provided within the module.

9. Apparatus according to claim 8, wherein the module is removably mountable to an exit region of the electron beam assembly.

10. Apparatus according to claim 8, when the apparatus further comprises a differential pressure element for dividing the first and second pressure environments and arranged to allow passage of each of, the electron beam to the sample, and x-rays from the sample, wherein the differential pressure element is arranged in a wall of the module.

11. Apparatus according to claim 10, wherein the differential pressure element is removably mountable to the module.

12. Apparatus according to claim 8, wherein the module further comprises at least one cooling device for cooling the at least one x-ray sensor element.

13. Apparatus according to claim 8, wherein the electron beam assembly includes a polepiece from which the electron beam emerges towards the sample and wherein the module is mounted within the polepiece or to the end of the polepiece.

14. Apparatus according to claim 1, wherein the at least one x-ray sensor element is arranged proximal to the sample assembly so as to maximise the solid angle for x-ray detection.

15. Apparatus according to claim 1, wherein the x-ray analysis apparatus comprises a scanning electron microscope.

16. A method of x-ray detection comprising:
    generating a focused electron beam within a first gas pressure environment of an electron beam assembly;
    providing a sample within a second gas pressure environment, such that the gas pressure in the second gas pressure environment is greater than the gas pressure within the first gas pressure environment;
    causing the electron beam to impinge upon the sample and thereby generate x-rays; and,
    receiving the generated x-rays using at least one x-ray sensor element of an x-ray detector, the at least one x-ray sensor element being within the first gas pressure environment and mounted to part of the electron beam assembly proximal to the sample.

17. The method of claim 16, wherein each of, the electron beam and the generated x-rays, is caused to pass between the first and second gas pressure environments through a differential pressure element which is operative to maintain the pressure differential between the first and second gas pressure environments.

18. The method of claim 17, wherein the at least one x-ray sensor element is positioned upon a first side of the differential pressure element and the sample is positioned upon a second side of the differential pressure element.

19. The method of claim 16, wherein the at least one x-ray sensor element is located so as to maximise the available solid angle for x-ray detection.

* * * * *